United States Patent [19]

Sogo

[11] Patent Number: 4,884,037
[45] Date of Patent: Nov. 28, 1989

[54] FM DEMODULATION CIRCUIT
[75] Inventor: Akira Sogo, Hamamatsu, Japan
[73] Assignee: Yamaha Corporation, Hamamatsu, Japan
[21] Appl. No.: 221,117
[22] Filed: Jul. 19, 1988
[30] Foreign Application Priority Data Jul. 28, 1987 [JP] Japan ............................. 62-188013
Jul. 28, 1987 [JP] Japan ............................. 62-188014

[51] Int. Cl.$^4$ ............................................. H03D 1/00
[52] U.S. Cl. ..................................... 329/336; 329/343
[58] Field of Search ............... 329/104, 107, 110, 126, 329/145; 375/80

[56] References Cited

U.S. PATENT DOCUMENTS 3,778,727 12/1973 Williams .......................... 329/145 X
4,243,977 1/1981 Everard ....................... 340/347 DD

FOREIGN PATENT DOCUMENTS 6222289 4/1981 Japan .

Primary Examiner—Eugene R. Laroche
Assistant Examiner—Robert J. Pascal
Attorney, Agent, or Firm—Scully, Scott, Murphy & Presser

[57] ABSTRACT

A FM demodulation circuit contains an analog-to-digital converter which converts an inputted frequency-modulated (FM) signal into a digital signal of one bit at a timing based on the predetermined clock signal and a differentiation circuit which differentiates the digital signal to thereby output a pulse train whose pulse density is in proportion to a frequency of the inputted FM signal. When the pulse train is supplied to a low-pass filter, the pulse train is converted into an analog signal, which is outputted as a demodulated signal. When the pulse train is supplied to a decimation circuit which includes a weight function generating portion and an accumulator, weighted function values are sequentially accumulated based on the level of the pulse train in the predetermined period so that the demodulated signal can be obtained in the form of a linear pulse code modulated (linear PCM) signal.

5 Claims, 4 Drawing Sheets

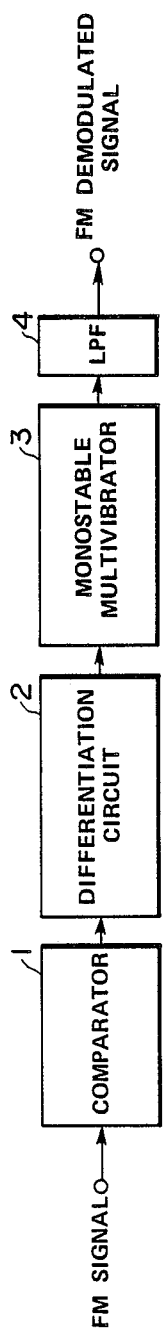
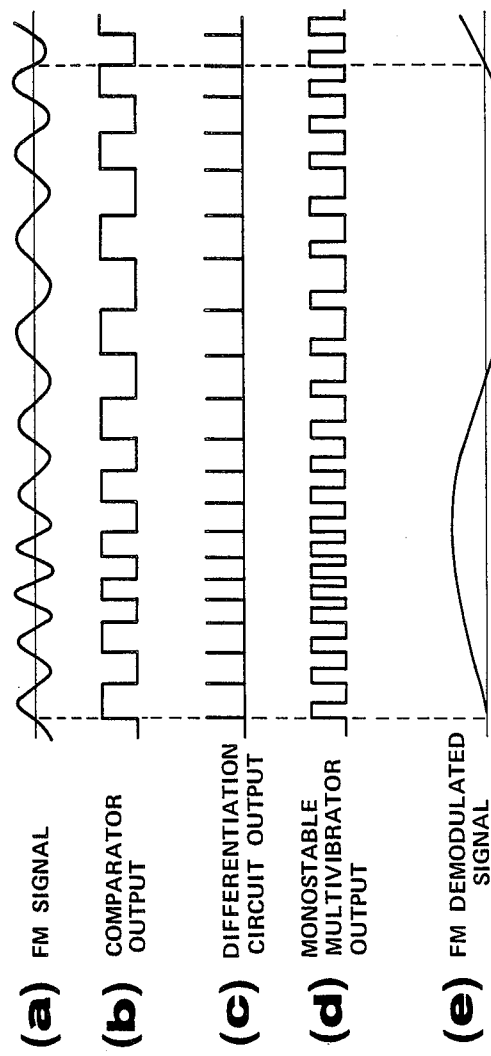

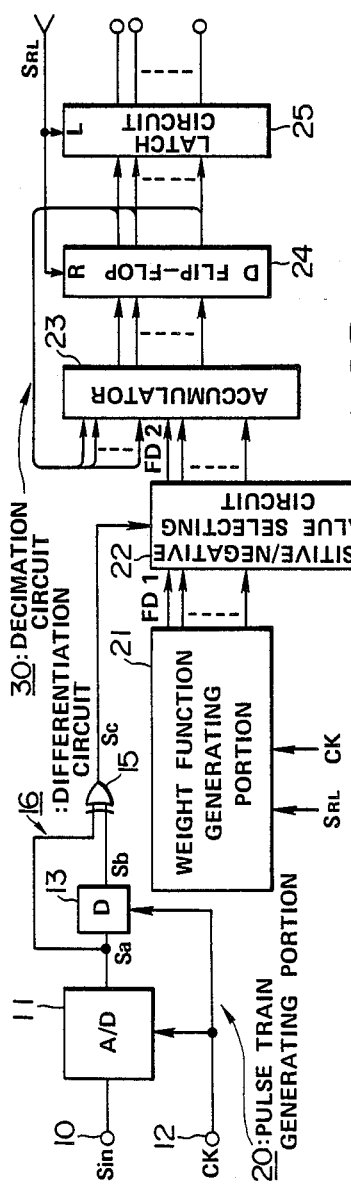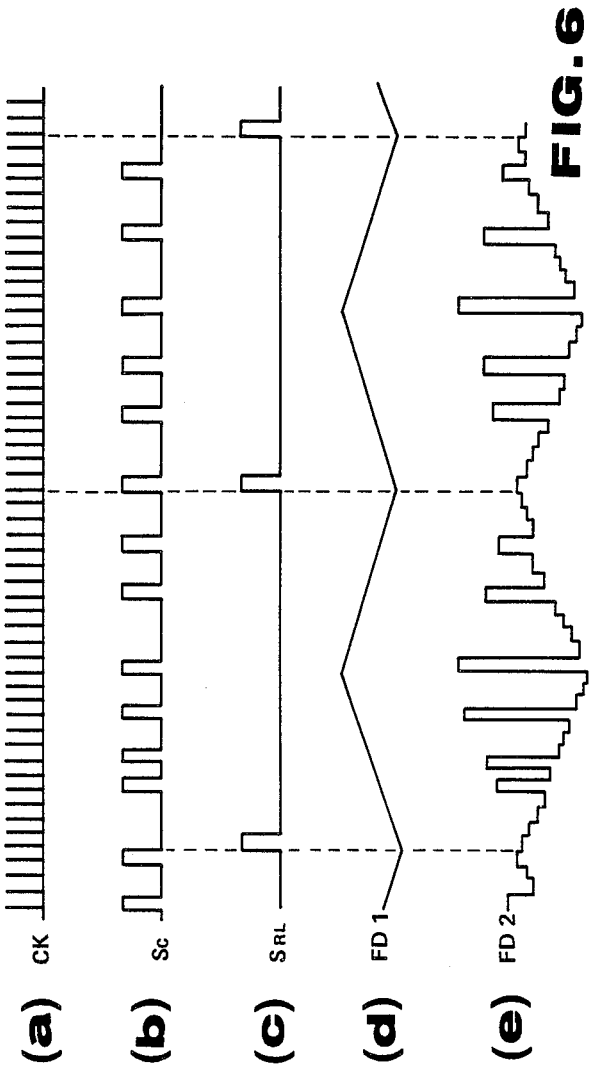

FM DEMODULATION CIRCUIT

BACKGROUND OF THE INVENTION

1. Field of the Invention

The present invention relates to a FM demodulation circuit, and more particularly to a FM demodulation circuit which can promote stabilization of circuit operation and does not need any adjustments and which can also obtain a demodulation output in the form of a pulse code modulated (PCM) signal.

2. Prior Art

As shown in FIG. 1, a conventional FM (frequency modulation) demodulation circuit is constituted by a comparator 1, a differentiation circuit 2, a monostable multivibrator 3 and a low-pass filter (LPF) 4. The comparator 1 compares a level of frequency-modulated (FM) wave with a reference level to thereby output a comparison result. The differentiation circuit 2 detects leading and trailing edges of an output signal of comparator 1 to thereby output a pulse signal. The monostable multivibrator 3 inputs this pulse signal outputted from the differentiation circuit 2 as a trigger signal to thereby output a pulse signal having the predetermined cycle. The LPF 4 filters out the low-frequency component signal from the pulse signal outputted from the monostable multivibrator 3. In the above-constituted FM demodulation circuit, the differentiation circuit 2 generates the trigger signal (shown in FIG. 2(c)) whose frequency is in proportion to the frequency of the inputted FM wave (shown in FIG. 2(a)). Hence, pulse density of the pulse signal outputted from the monostable multivibrator 3 will be in proportion to the frequency of the inputted signal thereof as shown in FIG. 2(d). Such pulse signal is converted into a smooth analog signal by the LPF 4 as shown in FIG. 2(e). Thus, the demodulation is completed.

In order to improve demodulation sensitivity in the above-mentioned conventional FM demodulation circuit, it is necessary to set optimum value between the pulse width of the pulse signal generated by the monostable multivibrator 3 and a carrier frequency of the FM wave. For this reason, there is a problem in that an adjustment of the pulse width is required and the stabilization of the pulse width becomes a problem.

Further, the low-pass filter 4 is required to have the characteristic which can sufficiently eliminate unnecessary higher harmonic wave components within the pulse train outputted from the pulse generating circuit (i.e., the monostable multivibrator 3). In addition, the resultant output signal of the conventional FM demodulation circuit must be in the form of an analog signal. Therefore, in the case where a latter stage (or latter-connected) circuit of this FM demodulation circuit needs digital processing, a band-limited LPF, a sample hold (S/H) circuit and the like must be required as an analog-to-digital (A/D) converter of twelve to sixteen bits having high accuracy and its peripheral circuits so that the cost will become higher.

SUMMARY OF THE INVENTION

Accordingly, it is a primary object of the invention to provide a FM demodulation circuit in which it is unnecessary to adjust the pulse width of the pulse train in the pulse generating portion and it is possible to increase the stability of the pulse width and which can also obtain the demodulation output in the form of a digital signal.

In a first aspect of the invention, there is provided a FM demodulation circuit comprising:

(a) analog-to-digital converting portion for converting an inputted frequency-modulated (FM) signal into a digital signal of one bit at a timing based on a predetermined clock signal;

(b) differentiation means including delay means and an exclusive OR circuit, the delay means delaying the digital signal by one clock of the clock signal, the exclusive OR circuit performing an exclusive OR operation between an output signal of the delay means and the digital signal; and (c) low-pass filter which is supplied with a pulse train outputted from the exclusive OR circuit, whereby a demodulated signal will be obtained from an output of the low-pass filter.

In a second aspect of the invention, there is provided a FM demodulation circuit comprising:

(a) analog-to-digital converting portion for converting an inputted frequency-modulated (FM) signal into a digital signal of one bit at a timing based on a predetermined clock signal;

(b) differentiation means for outputting a pulse train in synchronism with the clock signal at every time when a state of the digital signal outputted from the analog-to-digital converting portion varies; and (c) decimation circuit for weighting each pulse of the pulse train outputted from the differentiation means by weight function to thereby obtain a weighted function value and then accumulating the weighted function value during a predetermined period, so that the FM signal will be demodulated to thereby obtain a demodulated signal in the form of a linear pulse code modulated (a linear PCM) signal.

BRIEF DESCRIPTION OF THE DRAWINGS

Further objects and advantages of the present invention will be apparent from the following description, reference being had to the accompanying drawings wherein preferred embodiments of the present invention are clearly shown.

In the drawings:

FIG. 1 is a block diagram showing an electric constitution of an example of conventional FM demodulation circuit;

FIGS. 2(a) to 2(e) show waveforms for explaining a demodulation operation of the conventional FM demodulation circuit shown in FIG. 1;

FIG. 5 is a block diagram showing an electric constitution of a second embodiment of the present invention;

FIGS. 6(a) to 6(e) show waveforms at several points of the circuit shown in FIG. 5;

DESCRIPTION OF THE PREFERRED EMBODIMENTS

Figure 3:
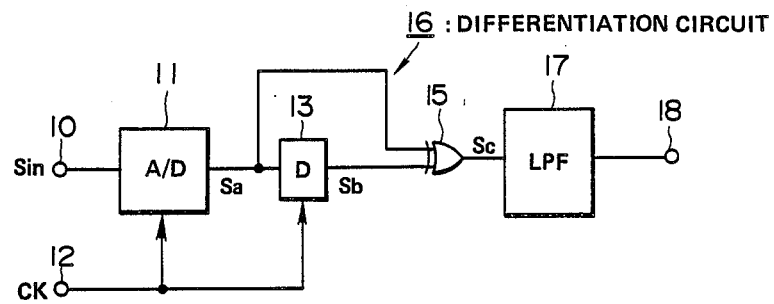
FIG. 3 is a block diagram showing an electric constitution of a first embodiment of the present invention.

Next, description will be given with respect to the embodiments of the present invention by referring to the drawings, wherein like reference characters designate like or corresponding parts throughout the several views.

[A] FIRST EMBODIMENT

FIG. 3 is a block diagram showing the electric constitution of the first embodiment of the present invention. In FIG. 3, a frequency-modulated signal (FM signal) Sin (see FIG. 4(b)) is supplied to an A/D converter 11 of one bit via an input terminal 10 as an input signal. The A/D converter 11 converts the inputted FM signal Sin into a digital signal of one bit (i.e., a "1" signal or a "0" signal) in synchronism with timings of a sampling clock CK (see FIG. 4(a)) supplied through a terminal 12. In this case, the period of sampling clock CK is set equal to a quarter of the period of a carrier signal of the inputted FM signal Sin. An output signal Sa of the A/D converter 11 is delayed by a delay 13 so that a delayed signal Sb will be obtained. The delay 13 operates based on the sampling clock CK so that the supplied signal thereof will be delayed by one sampling clock. Therefore, the signal Sb is generated by delaying the signal Sa by one sampling clock. These signals Sa and Sb are supplied to respective input terminals of an exclusive OR gate 15. The delay 13 and exclusive OR gate 15 constitute a differentiation circuit 16. An output signal Sc of this differentiation circuit 16 is supplied to a LPF 17, from which a demodulated signal will be outputted via an output terminal 18.

Next, description will be given with respect to the demodulation operation of this first embodiment described heretofore.

When the FM signal Sin shown in FIG. 4(b) is supplied to the input terminal 10, the A/D converter 11 performs an analog-to-digital (A/D) conversion operation. If such A/D conversion is performed based on the reference level as shown by a dashed line in FIG. 4(b), the output signal Sa of the A/D converter 11 has the waveform as shown in FIG. 4(c). Since the signal Sb is one sampling clock delayed signal of the signal Sa, the signal Sb has the waveform as shown in FIG. 4(d). Next, the signal Sc turns to the "1" signal when the level of the signal Sb is different from that of the signal Sa. Hence, this signal Sc has the waveform as shown in FIG. 4(e). In other words, the differentiation circuit 16 outputs one pulse at every time when the level of the signal Sa changes from the "1" level to the "0" level or when the level of the signal Sa changes from the "0" level to the "1" level. As a result, the pulse density of the signal Sc is in proportion to the frequency of the inputted signal Sin. Hence, the demodulated signal can be obtained by passing such signal Sc through the LPF 17.

According to the above-mentioned first embodiment, the pulse width of the signal Sc becomes equal to one clock cycle of the sampling clock CK, and the period of the sampling clock CK is set equal to a quarter of the period of the carrier signal of the FM wave. For this reason, the pulse width of the signal Sc will take desirable value in principle so that the adjustment thereof will become unnecessary. Further, it is possible to stabilize the period of the sampling clock CK at high accuracy. Hence, the pulse width of the signal SC will be highly stabilized.

Incidentally, in the case where the periods other than a quarter of the period of the carrier signal of the FM wave are adopted as for the pulse width of the signal Sc, the period of the sampling clock will be set in accordance with such adopted period.

[B] SECOND EMBODIMENT

FIG. 5 is a block diagram showing the second embodiment of the present invention. In FIG. 5, parts identical to those shown in FIG. 3 will be designated by the same numerals, hence, description thereof will be omitted. In the second embodiment, the sampling clock CK is set to have a frequency near 10 MHz, which is equal to fourfold frequency of the carrier frequency of the inputted FM signal Sin. In FIG. 5, a pulse train generating portion 20 is constituted by the input terminals 10 and 12, the A/D converter 11, the delay 13 and the exclusive OR gate 15 as shown in FIG. 3.

Next, a weight function generating portion 21 supplies a window function such as the Blackman-Harris window, the Hamming window, the Blackman window and the like to an input terminal of a positive/negative value selecting circuit 22. In this case, the weight function generating portion 21 sequentially outputs each function value of the weight function (see signal FD1 as shown in FIG. 6) at every time when each clock of the sampling clock CK is supplied thereto. The positive/negative value selecting circuit 22 directly supplies the function value outputted from the weight function generating portion 21 to a first terminal of an accumulator 23 when the signal Sc is the "1" signal, while this selecting circuit 22 converts the function value into negative value (i.e., complement value) and then such negative value is supplied to the first terminal of accumulator 23 when the signal Sc is the "0" signal. The output signal of the accumulator 23 is supplied to an input terminal of a delay (D) flip-flop 24 of plenty of bits. The output signal of D flip-flop 24 is supplied to a latch circuit 25 and also supplied to a second input terminal of the accumulator 23. The D flip-flop 24 is reset and latch circuit 25 performs a latch operation when a reset signal $S_{RL}$ is supplied thereto. This signal $S_{RL}$ has a frequency which is set near 50 kHz, and this signal $S_{RL}$ is also supplied to the above-mentioned weight function generating portion 21. Hence, the weight function generating portion 21 starts to output the function value of weight function at every time when the signal $S_{RL}$ is supplied thereto. In FIG. 5, a decimation circuit 30 is constituted by the weight function generating portion 21, the positive/negative value selecting circuit 22, the accumulator 23, the D flip-flop 24 and the latch circuit 25.

Next, description will be given with respect to the demodulation operation of the second embodiment.

Figure 4:
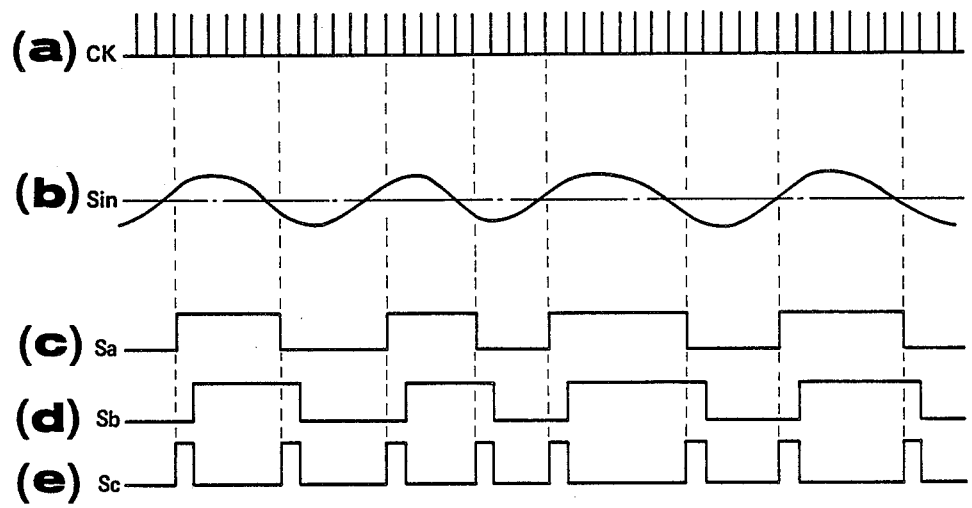
FIGS. 4(a) to 4(e) show waveforms at several points of the circuit shown in FIG. 3.

First, the pulse train generating portion 20 operates as described in the first embodiment by referring to FIG. 4, hence, the description of the operation thereof will be omitted.

Next, description will be given with respect to the operation of the decimation circuit 30.

At a first time when the reset signal $S_{RL}$ is outputted, the weight function generating portion 21 outputs the function value of predetermined window function (i.e., triangle window function of positive value in the second embodiment) as shown in FIG. 6(d). In this case, window function output operation is performed by sequentially outputting the values of the window function based on the clock CK (see FIGS. 6(a) and 6(d)). When the signal Sc outputted from the pulse train generating portion 20 is the "1" signal, the positive/negative value selecting circuit 22 selects the output value FD1 of the weight function generating portion 21 to thereby output the window function of positive value. On the other hand, when the signal Sc is the "0" signal, the positive/negative value selecting circuit 22 takes the complement of the output value of the weight function generating portion 21 to thereby output the window function of negative value. As a result, the signal FD2 supplied to the first input terminal of the accumulator 23 will be as shown in FIG. 6(e), so that the window function of positive or negative value is supplied to the accumulator 23 depending on whether the level of the signal Sc is "1" or "0" level. Thereafter, the output signal of the accumulator 23 is delayed by one clock in the D flip-flop 24 and then the delayed output signals thereof are supplied to the second input terminals of the accumulator 23. Due to the above-mentioned operation, the signal FD2 is sequentially accumulated, so that linear PCM data will be generated. Next, at a second time when the reset signal $S_{RL}$ is outputted again, the D flip-flop 24 is reset, and the linear PCM data representative of an accumulation value at this time are latched in the latch circuit 25, from which such latched data are outputted to the latter-stage circuit (not shown). In addition, at this second time when the reset signal $S_{RL}$ is outputted again, the weight function generating portion 21 starts to output the weight function again. Thereafter, the above-mentioned operation is repeatedly performed at every time when the reset signal $S_{RL}$ is outputted.

According to the second embodiment, the pulse width of the signal Sc becomes identical to one clock cycle of the sampling clock CK, hence, the adjustments of pulse width will not be required in principle. Further, the cycle of the sampling clock CK can be stabilized with high accuracy, hence, the pulse width of the signal Sc will have the high stabilization. In addition, the function of low-pass filter can be realized in digital manner by use of the decimation circuit 30. Hence, unnecessary higher harmonic waves within the signal Sc which contains the pulse train can be eliminated in the process of the decimation circuit 30. Further, it is possible to stabilize the characteristic and realize the desirable characteristic with ease. Furthermore, the linear PCM signal can be obtained as the resulting output of the second embodiment. Thus, the second embodiment is quite preferable to the case where the digital process is performed in the latter-stage circuit thereof.

[C] OPTICAL VIDEO DISK PLAYER

Next, description will be given with respect to an example of circuit adopting the FM demodulation circuit according to the second embodiment.

Figure 7:
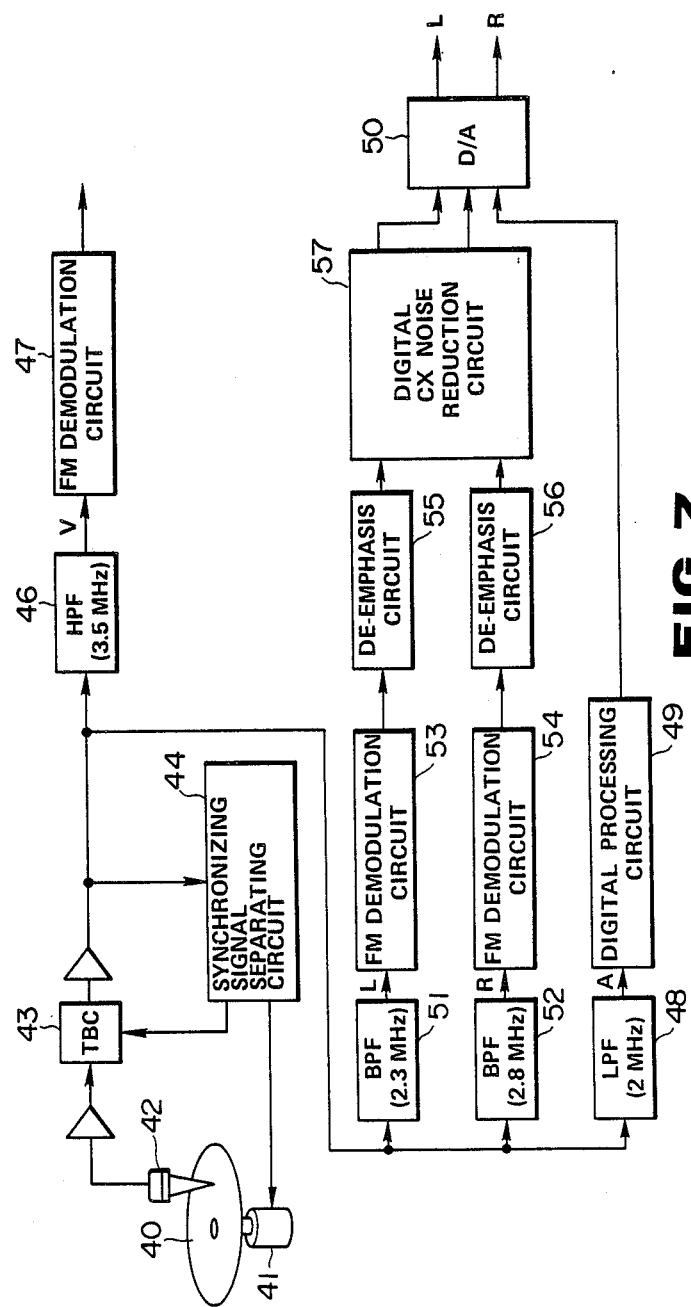
FIG. 7 is a block diagram shown an electric constitution of an optical video disk player which adopts the FM demodulation circuit according to the second embodiment of the present invention.

FIG. 7 is a block diagram showing the electric constitution of the optical video disk player which adopts the FM demodulation circuit according to the second embodiment. In FIG. 7, 40 designates an optical disk which is driven to be revolved by a motor 41. 42 designates an optical pick-up which converts optical information obtained from the optical disk 40 into an electric signal. Such reproduced electric signal contains FM modulated video and audio (L and R) signals (and a digital audio signal in case of the play-back of the video disc with digital audio recording), and such signal is passed through an amplifier and then supplied to a time base collector (TBC) 43 wherein jitters of the FM wave are absorbed. In addition, 44 designates a synchronizing signal separating circuit which separates a synchronizing signal from the reproduced signal. Based on the synchronizing signal, the time base collector 43 and the motor 41 are controlled.

Figure 8:
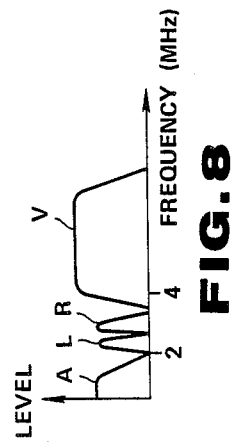
FIG. 8 is a diagram showing a frequency spectrum of the reproduced signal obtained by the circuit shown in FIG. 7.

FIG. 8 shows a frequency spectrum of the above reproduced signal. In FIG. 8, a frequency band V of higher than 3.5 MHz is used for a FM video signal, a frequency band L in the vicinity of 2.3 MHz is used for a left FM audio signal, a frequency band R in the vicinity of 2.8 MHz is used for a right FM audio signal, and a frequency band A of lower than 2 MHz is used for the digital audio signal. Incidentally, the digital audio signal is not recorded in some optical disks.

The FM video signal is filtered out from the above-mentioned reproduced signal by a high-pass filter (HPF) 46 having a cut-off frequency of 3.5 MHz, and then such FM video signal is demodulated by a FM demodulation circuit 47. Such demodulated FM video signal is outputted from the FM demodulation circuit 47 as a video signal. The digital audio signal is filtered out by a low-pass filter (LPF) 48 having a cut-off frequency of 2 MHz, and then such digital audio signal is processed in a digital processing circuit 49. Thereafter, the digital audio signal is divided and converted into left and right analog audio signals through a digital-to-analog (D/A) converter 50.

In addition, the right and left FM audio signals within the reproduced signal are respectively filtered out by a bandpass filter (BPF) 51 having a center frequency of 2.3 MHz and a BPF 52 having a center frequency of 2.8 MHz. Thereafter, the left and right FM audio signals are respectively supplied to FM demodulation circuits 53 and 54 according to the second embodiment of the present invention. In this case, each of output signals of the FM demodulation circuits 53 and 54 is in the form of the linear PCM signal of sixteen bits whose sampling rate corresponds to a frequency 44.1 kHz.

Next, the output signals of FM demodulation circuits 53 and 54 are passed through de-emphasis circuits 55 and 56 respectively and a digital CX noise reduction circuit 57 and then supplied to the D/A converter 50 wherein the digital signals outputted from the circuit 57 are converted into analog signals. These analog signals are outputted from the D/A converter as the right and left audio signals. The above digital CX noise reduction circuit 57 is constituted by a signal level expanding circuit. This circuit 57 double-expands the level of the signal which is higher than −28 dB so that the noises will be reduced. In this case, the linear PCM signal of sixteen bits is inputted into the digital CX noise reduction circuit 57 wherein all of the input signals are processed in the form of the digital PCM data of sixteen bits. Hence, the present optical video disk player can perform the reproducing operation with accuracy.

Incidentally, the period of the sampling clock CK is set identical to a quarter of the period of the carrier signal of the inputted FM signal Sin. However, it is possible to prevent the dead band from being occurred in the demodulation process and thereby obtain the linear demodulation characteristics by using frequency which is not included in the spectrum (including higher harmonic components) of the inputted FM signal Sin as the frequency of the sampling clock CK. For example, in case of the video disk player, the frequency band of the L channel signal is 2.3 MHz±150 KHz, while the frequency band of the R channel signal is 2.8 MHz±150 KHz. In this case, it is possible to set the above-mentioned frequency of the sampling clock CK identical to 12.7008 MHz (=4.2336 MHz×3), for example.

In addition, the present invention can be applied as the demodulation circuit of the FM audio signal in the HiFi VTR (video tape recorder of high fidelity).

Above is the description of the preferred embodiments of the present invention. This invention may be practiced or embodied in still other ways without departing from the spirit or essential character thereof. Therefore, the preferred embodiments described herein are illustrative and not restrictive, the scope of the invention being indicated by the appended claims and all variations which come within the meaning of the claims are intended to be embraced therein.

What is claimed is:

1. A FM demodulation circuit comprising:
   (a) analog-to-digital converting portion for converting an inputted frequency-modulated (FM) signal into a digital signal of one bit at a timing based on a predetermined clock signal;
   (b) differentiation means for outputting a pulse train in synchronism with said clock signal at every time when a state of said digital signal outputted from said analog-to-digital converting portion varies; and
   (c) decimation circuit for weighting each pulse of said pulse train outputted from said differentiation means by a weight function to thereby obtain a weighted function value and then accumulating said weighted function value during a predetermined period, so that said FM signal will be demodulated to thereby obtain a demodulated signal in the form of a linear pulse code modulated (a linear PCM) signal.

2. A FM demodulation circuit according to claim 1 wherein said weight function is a window function representative of Blackman-Harris window, Hamming window or Blackman window.

3. A FM demodulation circuit according to claim 1 wherein said differentiation means includes delay means and an exclusive OR circuit, said delay means delaying said digital signal by one clock of said clock signal, said exclusive OR circuit performing an exclusive OR operation between an output signal of said delay means and said digital signal to thereby obtain said pulse train in synchronism with said clock signal.

4. A FM demodulation circuit according to claim 1 wherein said decimation circuit further comprises:
   (a) weight function generating portion for generating said weight function and then outputting each said weighted function value of said weight function in accordance with said clock signal;
   (b) positive/negative value selecting circuit for directly passing said weighted function value when said digital signal is a "1" signal, said positive/negative value selecting circuit converting said weighted function value into a negative value which is outputted therefrom when said digital signal is a "0" signal; and
   (c) accumulating means for accumulating values outputted through said positive/negative value selecting circuit during said predetermined period to thereby obtain said demodulated signal.

5. A FM demodulating circuit according to claim 4 wherein said accumulating means further comprises an accumulator, a delay flip-flop and a latch circuit, said delay flip-flop delaying an output value of said accumulator by one clock of said clock signal, said value outputted from said positive/negative value selecting circuit being supplied to a first input terminal of said accumulator and a delayed output value of said delay flip-flop being supplied to a second input terminal of said accumulator so that said accumulator sequentially adds together the output values of said positive/negative value selecting circuit and said delay flip-flop, said output value of said delay flip-flop being outputted as said linear PCM signal via said latch circuit.

* * * * *